(12) United States Patent
Choi et al.

(10) Patent No.: US 7,247,897 B2
(45) Date of Patent: Jul. 24, 2007

(54) CONDUCTIVE LINE FOR A SEMICONDUCTOR DEVICE USING A CARBON NANOTUBE INCLUDING A MEMORY THIN FILM AND SEMICONDUCTOR DEVICE MANUFACTURED

(75) Inventors: Won-bong Choi, Suwon-si (KR); Eun-ju Bae, Yongin-si (KR); Hideki Horii, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/258,037

(22) Filed: Oct. 26, 2005

(65) Prior Publication Data

US 2006/0046445 A1   Mar. 2, 2006

Related U.S. Application Data

(62) Division of application No. 10/835,044, filed on Apr. 30, 2004, now Pat. No. 7,060,543.

(30) Foreign Application Priority Data

May 1, 2003  (KR) ............................ 2003-28000

(51) Int. Cl.
  *H01L 29/76*   (2006.01)
  *H01L 29/84*   (2006.01)
  *H01L 31/062*  (2006.01)
  *H01L 31/113*  (2006.01)
  *H01L 31/119*  (2006.01)
  *H01L 21/302*  (2006.01)
  *H01L 21/461*  (2006.01)

(52) U.S. Cl. ............... 257/288; 257/774; 257/E21.577; 257/E21.585; 438/257; 438/396; 438/675; 977/750

(58) Field of Classification Search ................ 257/288, 257/774, E21.577, E21.585; 977/750; 438/257, 438/396, 675
See application file for complete search history.

(56) References Cited

U.S. PATENT DOCUMENTS

| 6,712,984 | B2 | 3/2004 | Sasaki et al. | |
| 6,837,928 | B1 | 1/2005 | Zhang et al. | |
| 2002/0163079 | A1 * | 11/2002 | Awano | ..................... 257/750 |
| 2003/0179559 | A1 | 9/2003 | Engelhardt et al. | |
| 2004/0120183 | A1 | 6/2004 | Appenzeller et al. | |

FOREIGN PATENT DOCUMENTS

WO   WO 01/61753   8/2001

OTHER PUBLICATIONS

Delzeit, et al., "Growth of multiwall carbon nanotubes in an inductively coupled plasma reactor", J. Applied Physics, vol. 91, No. 9, pp. 6027-6033, (May 1, 2002).

(Continued)

*Primary Examiner*—William M. Brewster
(74) *Attorney, Agent, or Firm*—Lee & Morse, P.C.

(57) ABSTRACT

In a method of forming a conductive line for a semiconductor device using a carbon nanotube and a semiconductor device manufactured using the method, the method includes activating a surface of an electrode of the semiconductor device using surface pretreatment to create an activated surface of the electrode, forming an insulating layer on the activated surface of the electrode, and forming a contact hole through the insulating layer to expose a portion of the activated surface of the electrode, and supplying a carbon-containing gas onto the activated surface of the electrode through the contact hole to grow a carbon nanotube, which forms the conductive line, on the activated surface of the electrode. Alternatively, the activation step of the surface of the electrode may be replaced with a formation of a catalytic metal layer on the surface of the electrode.

22 Claims, 7 Drawing Sheets

OTHER PUBLICATIONS

Delzeit, et al., "Growth of carbon nanotubes by thermal and plasma chemical vapour deposition processes and applications in microscopy", Nanotechnology, vol. 13, No. 3, pp. 280-284, (Jun. 2002).

Sohn, et al., "Effects of Fe Film Thickness and Pretreatments on the Growth Behaviours of Carbon Nanotubes on Fe-doped (001) Si Substrates", JPN. J. Applied Physics, vol. 42, pp. 4731-4736, (Jul. 2002).

Suh, et al., "Highly ordered two-dimensional carbon nanotube arrays", Applied Physics Letters, vol. 75, No. 14, pp. 2047-2049, (Oct. 4, 1999).

* cited by examiner

CONDUCTIVE LINE FOR A SEMICONDUCTOR DEVICE USING A CARBON NANOTUBE INCLUDING A MEMORY THIN FILM AND SEMICONDUCTOR DEVICE MANUFACTURED

CROSS REFERENCE TO RELATED APPLICATION(S)

This is a divisional application based on pending application Ser. No. 10/835,044, filed Apr. 30, 2004 now U.S. Pat. No. 7,060,543 B1, the entire contents of which is hereby incorporated by reference.

BACKGROUND OF THE INVENTION

1. Field of the Invention

The present invention relates to a method of forming a conductive line for a semiconductor device. More particularly, the present invention relates to a method of forming a conductive line for a semiconductor device using a carbon nanotube. The present invention also relates to a semiconductor device manufactured using the method.

2. Description of the Related Art

There are many different types of semiconductor devices, and more particularly, semiconductor memory devices, e.g., DRAM (Dynamic Random Access Memory or Dynamic RAM), SRAM (Static RAM), PRAM (Phase-change RAM), and MRAM (Magnetic RAM). In such semiconductor memory devices, a Metal-Oxide-Semiconductor (MOS) transistor is generally used as a switching device. In addition, semiconductor memory devices are provided with conductive lines, such as contacts and interconnects, as pathways for electron migration.

Recently, as semiconductor memory devices have become more highly integrated, a width of conductive lines has decreased and an intensity of current per unit surface area, i.e., current density, has increased. In this regard, it is anticipated that the current density of conductive lines for semiconductor devices will reach approximately $10^6$ A/cm$^2$ in about the year 2010.

Meanwhile, conventional semiconductor devices primarily use metal conductive lines. It is known that the minimum width of metal conductive lines is about 70 nm and the maximum current density of metal conductive lines is about $10^6$ A/cm$^2$. A decrease of the width and an increase of the current density of conductive lines are requisite for higher integration of semiconductor devices. However, for the foregoing reasons, it is anticipated that semiconductor devices using metal conductive lines will encounter the limitation of integration in the near future.

Therefore, in order to continuously realize higher integration of semiconductor devices, there is a need to develop new materials for conductive lines that are able to provide a high current density at widths smaller than those of metal conductive lines.

SUMMARY OF THE INVENTION

The present invention is therefore directed to a method of forming a conductive line for a semiconductor device using a carbon nanotube and a semiconductor device manufactured using that method, which substantially overcomes one or more of the problems due to the limitations and disadvantages of the related art.

It is therefore a feature of an embodiment of the present invention to provide a method of forming a conductive line for a semiconductor device, including growing a carbon nanotube on a surface of an electrode, which makes it possible to accomplish high integration of a semiconductor device.

It is another feature of an embodiment of the present invention to provide a semiconductor device capable of being highly integrated by having a conductive line composed of a carbon nanotube formed by the above-described method.

According to a first embodiment of the present invention, there is provided a method of forming a conductive line for a semiconductor device including activating a surface of an electrode of the semiconductor device using surface pretreatment to create an activated surface of the electrode, forming an insulating layer on the activated surface of the electrode, and forming a contact hole through the insulating layer to expose a portion of the activated surface of the electrode, and supplying a carbon-containing gas onto the activated surface of the electrode through the contact hole to grow a carbon nanotube, which forms the conductive line, on the activated surface of the electrode.

Activating the surface of the electrode of the semiconductor device may further include supplying at least one pretreatment gas selected from the group consisting of nitrogen ($N_2$) gas, argon (Ar) gas, and ammonia ($NH_3$) gas onto the surface of the electrode, in a porous state, at a temperature in a range of about 300 to 700° C.

Alternatively, activating the surface of the electrode of the semiconductor device may further include colliding an ionized argon (Ar) or nitrogen ($N_2$) gas with the surface of the electrode, in a porous state. In another alternative, activating the surface of the electrode of the semiconductor device may include performing a reactive ion etch (RIE).

Activating the surface of the electrode of the semiconductor device may be performed at room temperature.

Activating the surface of the electrode of the semiconductor device may include controlling the activating to form the activated surface of the electrode to a thickness of about several nanometers to several tens of nanometers.

Forming the insulating layer may include using an oxide.

Forming the contact hole may include anisotropically etching the insulating layer using a patterned photoresist as an etching mask.

Forming the contact hole may include creating the contact hole having a diameter of about several nanometers to several tens of nanometers.

Supplying the carbon-containing gas onto the activated surface of the electrode through the contact hole to grow a carbon nanotube may be performed at a temperature in a range of about 500 to 900° C.

The carbon-containing gas may be at least one gas selected from the group consisting of methane ($CH_4$), acetylene ($C_2H_2$), ethylene ($C_2H_4$), ethane ($C_2H_6$), carbon monoxide (CO), and carbon dioxide ($CO_2$). The method may further include supplying the carbon-containing gas together with at least one gas selected from the group consisting of hydrogen ($H_2$), nitrogen ($N_2$), and argon (Ar).

Supplying the carbon-containing gas onto the activated surface of the electrode through the contact hole to grow a carbon nanotube may include performing a thermal chemical vapor deposition or a plasma enhanced chemical vapor deposition.

According to another embodiment of the present invention, there is provided a method of forming a conductive line for a semiconductor device including forming a catalytic metal layer on a surface of an electrode of the semiconductor device, forming an insulating layer on the catalytic metal layer, and forming a contact hole through the insulating layer to expose a portion of the catalytic metal layer, and supplying a carbon-containing gas onto the catalytic metal layer through the contact hole to grow a carbon nanotube, which forms the conductive line, on the catalytic metal layer.

Forming the catalytic metal layer may include depositing a catalytic metal to a predetermined thickness on the surface of the electrode using a radio frequency (RF) magnetron sputter or an e-beam evaporator.

Alternatively, forming the catalytic metal layer may include spraying a catalytic metal powder to a predetermined thickness on the surface of the electrode.

The catalytic metal layer may be formed to a thickness of about several nanometers to several tens of nanometers.

Forming the catalytic metal layer may include using at least one transition metal selected from the group consisting of tungsten (W), nickel (Ni), iron (Fe), cobalt (Co), yttrium (Y), palladium (Pd), platinum (Pt), or gold (Au).

Forming the insulating layer may include using an oxide.

Forming the contact hole may include anisotropically etching the insulating layer using a patterned photoresist as an etching mask. Forming the contact hole may include creating the contact hole having a diameter of about several nanometers to several tens of nanometers.

Supplying the carbon-containing gas onto the catalytic metal layer through the contact hole to grow a carbon nanotube may be performed at a temperature in a range of about 500 to 900° C.

The carbon-containing gas may be at least one gas selected from the group consisting of methane ($CH_4$), acetylene ($C_2H_2$), ethylene ($C_2H_4$), ethane ($C_2H_6$), carbon monoxide (CO), and carbon dioxide ($CO_2$). The method may further include supplying the carbon-containing gas together with at least one gas selected from the group consisting of hydrogen ($H_2$), nitrogen ($N_2$), and argon (Ar).

Supplying the carbon-containing gas may include performing a thermal chemical vapor deposition or a plasma enhanced chemical vapor deposition.

According to yet another embodiment of the present invention, there is provided a semiconductor device including a substrate, a first electrode formed on the substrate, a porous active layer formed on a surface of the electrode, an insulating layer, which is formed on the porous active layer, having a contact hole therethrough to expose a portion of the porous active layer, a carbon nanotube, which is grown on the porous active layer in the contact hole and forms a conductive line as a pathway for electron migration, and a component selected from the group consisting of a memory thin film and a second electrode, the component being formed on the insulating layer and electrically connected to the carbon nanotube.

The porous active layer may be formed by supplying at least one pretreatment gas selected from the group consisting of nitrogen ($N_2$), argon (Ar), and ammonia ($NH_3$), at a temperature in a range of about 300 to 700° C. onto the surface of the electrode. Alternatively, the porous active layer may be formed by colliding an ionized argon (Ar) or nitrogen ($N_2$) gas with the surface of the electrode.

The substrate may be made of silicon or oxide.

The first electrode may be a source electrode of a Metal Oxide Semiconductor Field Effect Transistor (MOSFET). The memory thin film may be made of a phase-change material.

According to still another embodiment of the present invention, there is provided a semiconductor device including a substrate, a first electrode formed on the substrate, a catalytic metal layer formed on a surface of the electrode, an insulating layer, which is formed on the catalytic metal layer, having a contact hole therethrough to expose a portion of the catalytic metal layer, a carbon nanotube, which is grown on the catalytic metal layer in the contact hole and forms a conductive line as a pathway for electron migration, and a component selected from the group consisting of a memory thin film and a second electrode, the component being formed on the insulating layer and electrically connected to the carbon nanotube.

The catalytic metal layer may be formed by depositing at least one transition metal selected from the group consisting of tungsten (W), nickel (Ni), iron (Fe), cobalt (Co), yttrium (Y), palladium (Pd), platinum (Pt), or gold (Au) using an RF magnetron sputter or an e-beam evaporator on the surface of the electrode. Alternatively, the catalytic metal layer may be formed by applying a powder of at least one transition metal selected from the group consisting of tungsten (W), nickel (Ni), iron (Fe), cobalt (Co), yttrium (Y), palladium (Pd), platinum (Pt), or gold (Au) onto the surface of the electrode.

The substrate may be made of silicon or oxide.

The first electrode may be a source electrode of a Metal Oxide Semiconductor Field Effect Transistor (MOSFET). The memory thin film may be made of a phase-change material.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
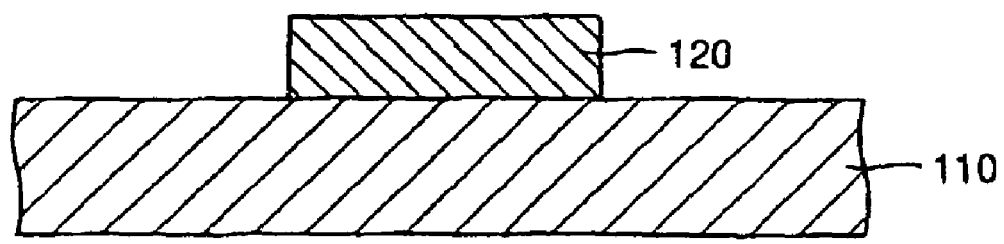
FIGS. 1A through 1D illustrate sectional views showing sequential stages in a process of forming a conductive line for a semiconductor device using a carbon nanotube according to a first embodiment of the present invention.

Korean Patent Application No. 2003-28000, filed on May 1, 2003, in the Korean Intellectual Property Office, and entitled: "Method of Forming Conductive Line for Semiconductor Device Using Carbon Nanotube and Semiconductor Device Manufactured Using the Method," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Like reference numerals refer to like elements throughout.

FIGS. 1A through 1D illustrate sectional views showing sequential stages in a process of forming a conductive line for a semiconductor device using a carbon nanotube according to a first embodiment of the present invention.

FIG. 1A shows an electrode 120 formed on a substrate 110 for a semiconductor device. Referring to FIG. 1A, the substrate 110 may be a silicon wafer, glass or the like. The electrode 120 may be formed on a predetermined material layer, e.g., an insulating layer, instead of the substrate 110. The electrode 120 may be made of a metal having good conductivity or doped silicon. More specifically, the electrode 120 may be made of doped silicon when formed on the silicon substrate 110, as in a case of a source electrode of a Metal-Oxide-Semiconductor Field Effect Transistor (MOSFET). Alternatively, the electrode 120 may be made of a metal having good conductivity when formed on an insulating layer.

Figure 1B:
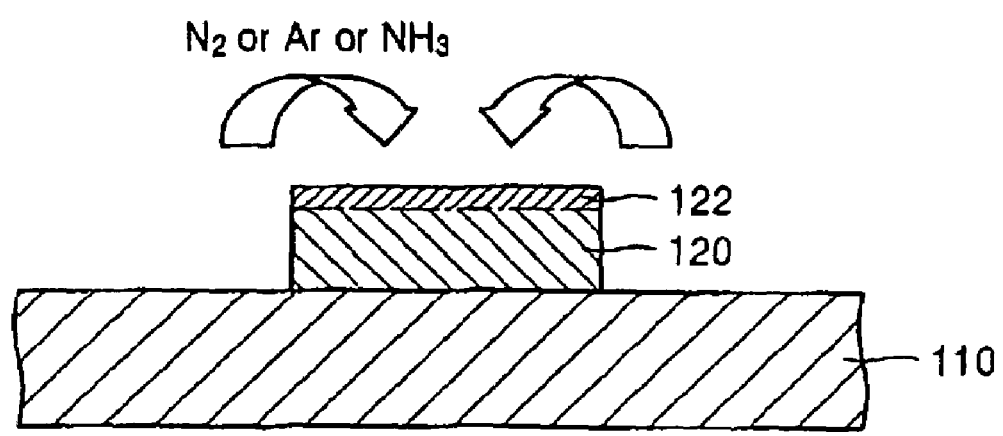

FIG. 1B illustrates a sectional view showing a process of activating a surface of the electrode 120 using surface pretreatment. Referring to FIG. 1B, when the substrate 110 and the electrode 120 reach a temperature in a range of about 300 to 700° C., a pretreatment gas is supplied onto the surface of the electrode 120 to activate the surface of the electrode 120 in a porous state. As a result, an active layer 122, on which a carbon nanotube is to be grown, is formed on the surface of the electrode 120. A nitrogen ($N_2$) gas, an argon (Ar) gas, or an ammonia ($NH_3$) gas may be used as the pretreatment gas. A duration and a flow rate for supplying the pretreatment gas are controlled so that a thickness of the active layer 122 is in a range of about several nanometers to several tens of nanometers.

Alternatively, the surface of the electrode 120 may be activated in a porous state by colliding an ionized Ar or $N_2$ gas with the surface of the electrode 120. This activation process can also form the active layer 122, which ensures growth of a carbon nanotube on the surface of the electrode 120. This activation process may be performed using a reactive ion etching (RIE) system. An advantage of this activation process is that it can be performed at room temperature without having to heat the substrate 110 and the electrode 120.

Figure 1C:
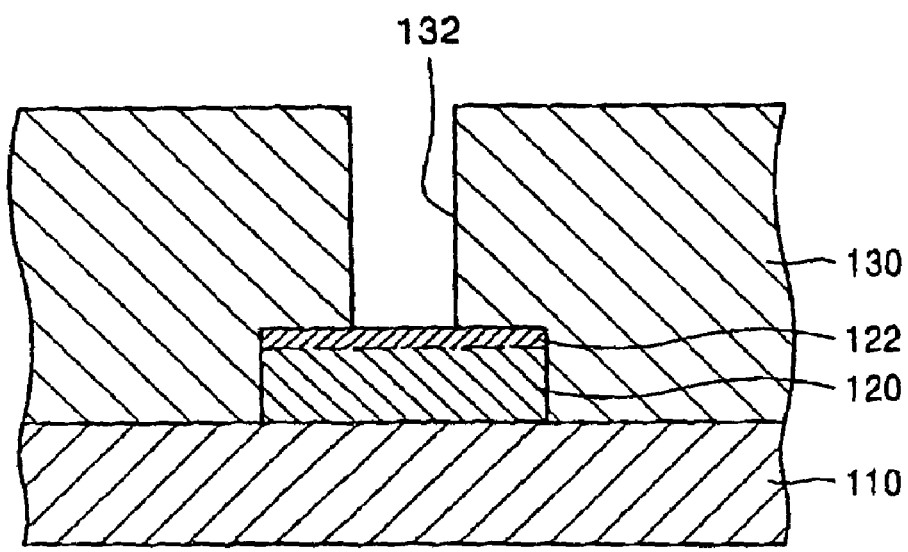

FIG. 1C illustrates a sectional view showing a structure of an insulating layer 130 and a contact hole 132 formed on the electrode 120. Referring to FIG. 1C, initially, the insulating layer 130 may be formed over the entire electrode 120, the surface of which having the active layer 122 formed thereon, as shown in FIG. 1B. The insulating layer 130 may be made of oxide, e.g., silicon oxide ($SiO_2$).

Subsequently, the contact hole 132 is formed through the insulating layer 130 to expose a portion of the surface of the active layer 122. More specifically, a photoresist is applied over the insulating layer 130 and patterned in a predetermined shape. Then, the insulating layer 130 is anisotropically etched using the patterned photoresist as an etching mask to form the contact hole 132. The contact hole 132 may be formed having a diameter of about several nanometers to several tens of nanometers.

Figure 3:
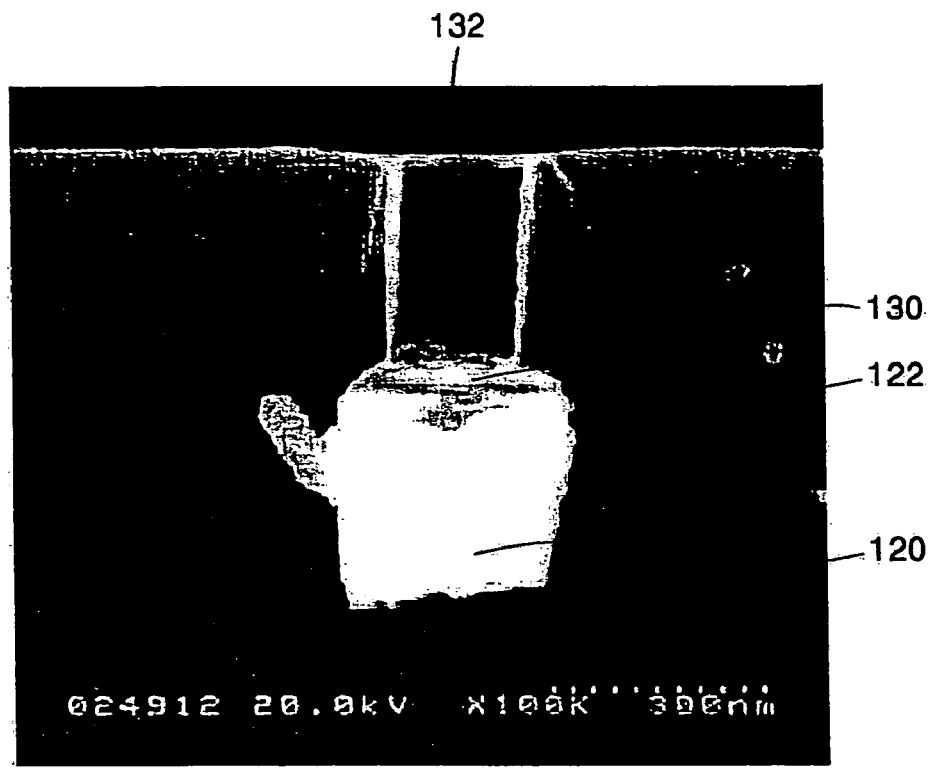
FIG. 3 is a photograph showing a structure of an active layer and a contact hole formed on an electrode after the process shown in FIG. 1C.

After the process shown in FIG. 1C, the active layer 122 formed on the surface of the electrode 120 and the contact hole 132 exposing the active layer 122 through the insulating layer 130 is shown in the photograph of FIG. 3.

Figure 1D:
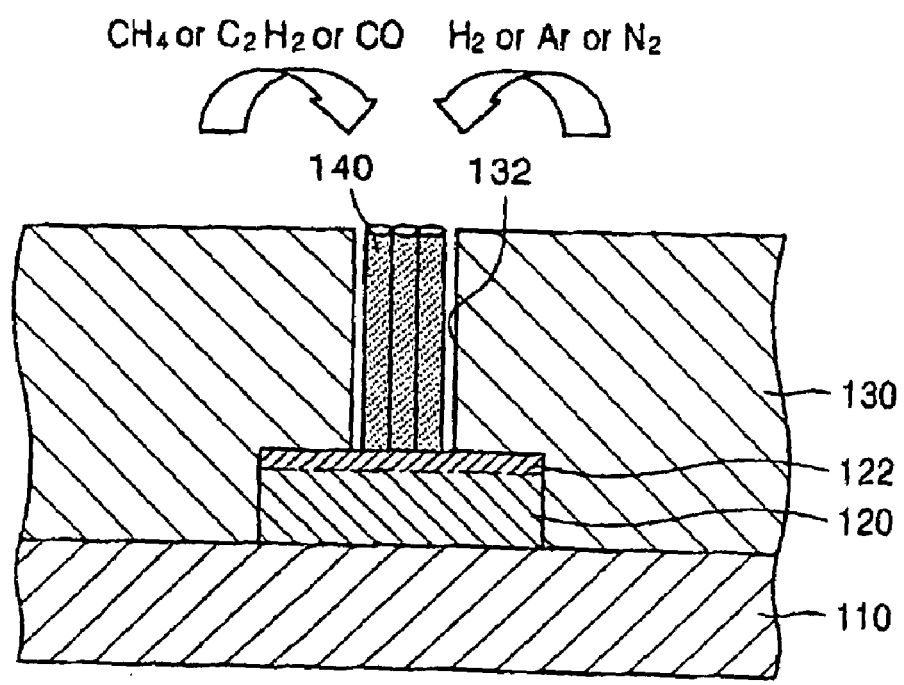

FIG. 1D illustrates a sectional view showing a structure of a carbon nanotube 140 grown on the active layer 122 in the contact hole 132. In FIG. 1D, the growth of the carbon nanotube 140 can be performed using a thermal chemical vapor deposition or a plasma enhanced chemical vapor deposition. The growth of the carbon nanotube 140 may also be performed using any other known method.

Referring to FIG. 1D, the resultant structure formed by the above-described processes shown in FIGS. 1A through 1C is placed in a reaction furnace and then the reaction furnace is set to a temperature in a range of about 500 to 900° C. Then, a carbon-containing gas, such as methane ($CH_4$), acetylene ($C_2H_2$), ethylene ($C_2H_4$), ethane ($C_2H_6$), carbon monoxide (CO), and carbon dioxide ($CO_2$), is supplied into the reaction furnace. For illustrative purposes, some examples of a suitable carbon-containing gas are shown in FIG. 1D. The carbon-containing gas may be supplied into the reaction furnace together with hydrogen ($H_2$), nitrogen ($N_2$), or argon (Ar) gas. The carbon-containing gas supplied into the reaction furnace contacts the active layer 122 formed on the surface of the electrode 120 through the contact hole 132. As a result, the carbon nanotube 140 is grown in a vertical direction from the active layer 122.

Subsequently, a component, which may be another type of electrode (250 of FIG. 7) or a memory thin film (280 of FIG. 7), may be formed on the insulating layer 130 to be connected to the carbon nanotube 140. The carbon nanotube 140 forms a conductive line, such as a contact or an interconnect, for connecting the electrode 120 and the component, i.e., another type of electrode or the memory thin film.

Figure 2A:
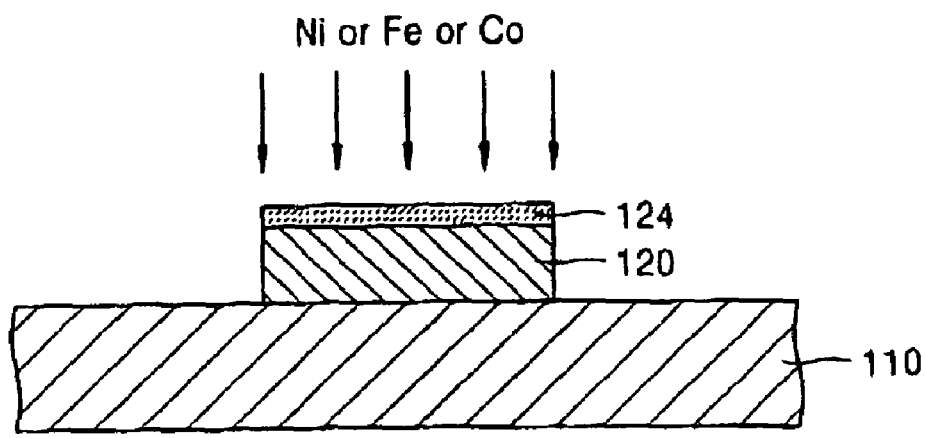
FIGS. 2A and 2B illustrate schematic sectional views showing processes of forming a conductive line for a semiconductor device using a carbon nanotube according to a second embodiment of the present invention.
Figure 2B:
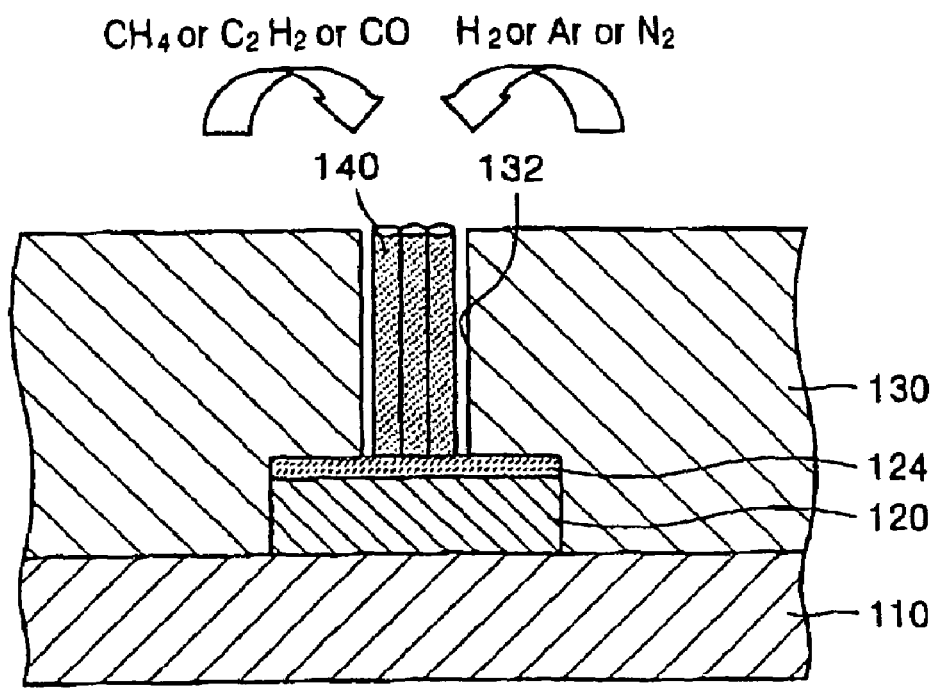

FIGS. 2A and 2B illustrate schematic sectional views showing processes of forming a conductive line for a semiconductor device using a carbon nanotube according to a second embodiment of the present invention. The method of the second embodiment is substantially similar to the method of the first embodiment except that a catalytic metal layer 124 is formed on the surface of the electrode 120 and the surface of the electrode is not activated. Accordingly, the second embodiment will be briefly described in view of the matters that differ from the first embodiment.

FIG. 2A illustrates a sectional view showing a structure of the catalytic metal layer 124 formed on the surface of the electrode 120. Referring to FIG. 2A, the catalytic metal layer 124, which ensures the growth of the carbon nanotube, is formed by depositing a catalytic metal to a predetermined thickness on the surface of the electrode 120 using a radio frequency (RF) magnetron sputter or an e-beam evaporator. The catalytic metal may be a transition metal such as tungsten (W), nickel (Ni), iron (Fe), cobalt (Co), yttrium (Y), palladium (Pd), platinum (Pt), or gold (Au). For illustrative purposes, some examples of a suitable transition metal are shown in FIG. 2A. The catalytic metal layer 124 may be formed to a thickness of about several nanometers to several tens of nanometers.

Alternatively, the catalytic metal layer 124 may be formed by applying a transition metal powder to a predetermined thickness on the surface of the electrode 120. Application of the transition metal powder may be performed to a thickness of about several nanometers to several tens of nanometers using spraying. An advantage of this process is that the catalytic metal layer 124 can be more easily formed in a coarse porous state.

According to the second embodiment of the present invention, the catalytic metal layer 124 is separately formed on the surface of the electrode 120 to grow the carbon nanotube. Therefore, the second embodiment is different from the first embodiment, which directly activates the surface of the electrode 120 to grow the carbon nanotube. However, processes subsequent to the formation of the catalytic metal layer 124 on the surface of the electrode 120 in the second embodiment are the same as those described in connection with the first embodiment. Therefore, the processes subsequent to the formation of the catalytic metal layer 124 will only be briefly described with reference to FIG. 2B.

As shown in FIG. 2B, the insulating layer 130, e.g., an oxide, is formed on the catalytic metal layer 124. Then, the insulating layer 130 is anisotropically etched using a patterned photoresist as an etching mask to form the contact hole 132 having a diameter of about several nanometers to several tens of nanometers. As a result, a portion of the surface of the catalytic metal layer 124 is exposed through the contact hole 132.

Subsequently, while a carbon-containing gas, such as $CH_4$, $C_2H_2$, $C_2H_4$, $C_2H_6$, CO, or $CO_2$, and an $H_2$, $N_2$, or Ar gas, are supplied into the reaction chamber at a temperature in a range of about 500 to 900° C., the carbon nanotube 140 is grown in a vertical direction from the surface of the catalytic metal layer 124. For illustrative purposes, some examples of a suitable carbon-containing gas are shown in FIG. 2B.

Figure 4:
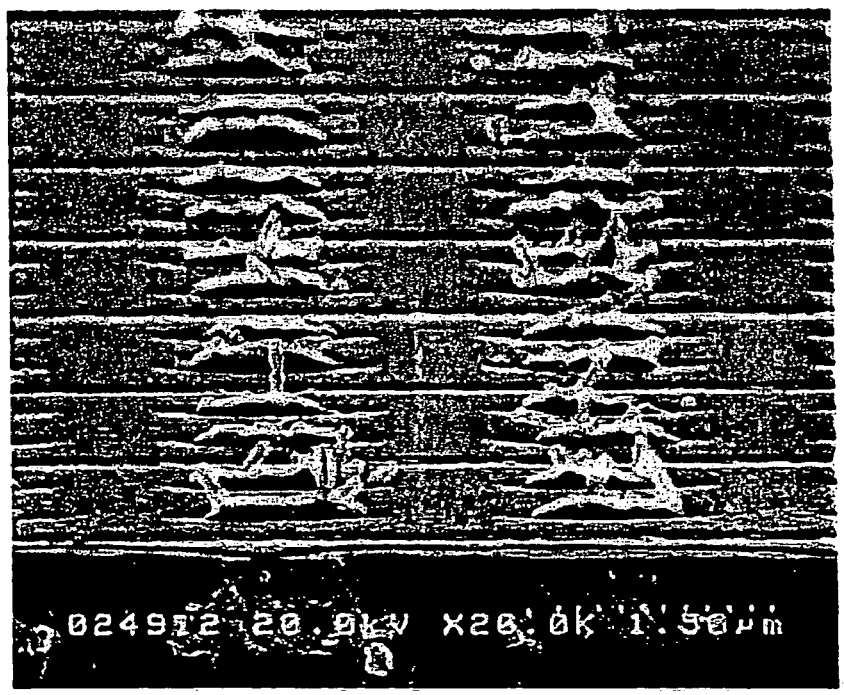
FIGS. 4 and 5 are photographs showing carbon nanotubes grown on a surface of an electrode.
Figure 5:
Figure 6:
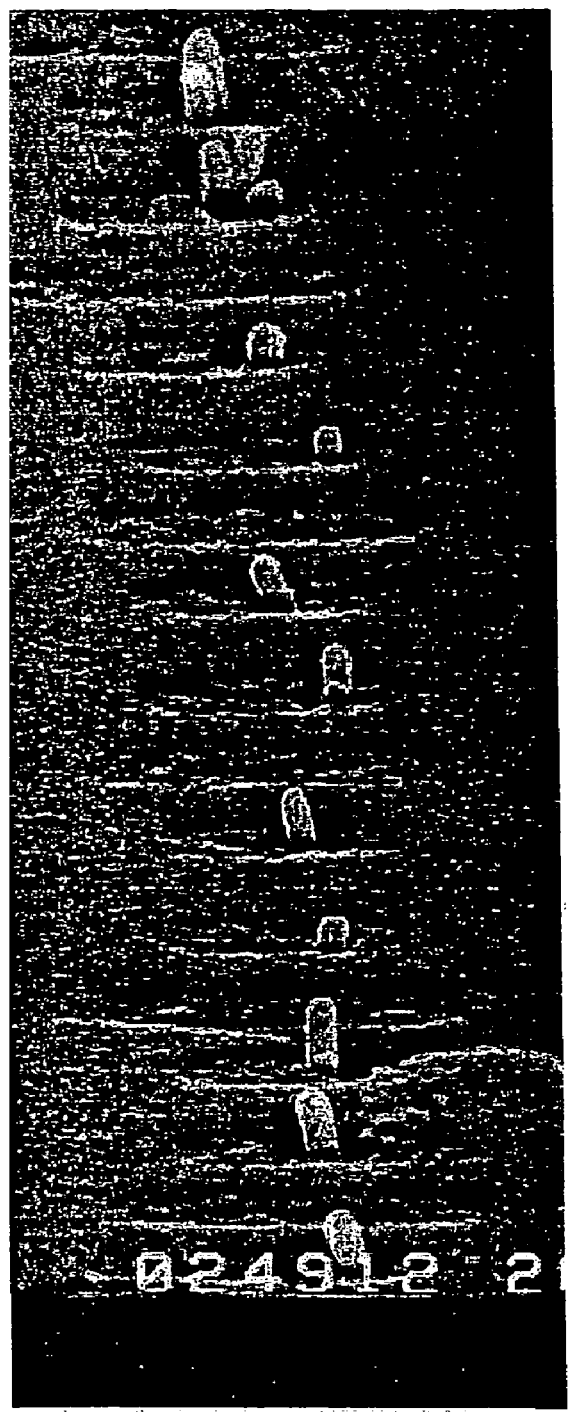
FIG. 6 is a photograph showing a uniformly arrayed structure of carbon nanotubes formed in a contact hole according to a conductive line formation method of the present invention.

The photographs of FIGS. 4 and 5 show carbon nanotubes grown on an activated surface of an electrode. The photograph of FIG. 6 shows a uniformly arrayed structure of carbon nanotubes formed in a contact hole according to a conductive line formation method of the present invention.

As described above, according to the conductive line formation methods of the first and second embodiments of the present invention, the carbon nanotube can form a conductive line, such as a contact and an interconnect, for connecting the electrode 120 and the component, i.e., another type of electrode or the memory thin film. Such a carbon nanotube has a current density of $10^{10}$ A/cm$^2$, which is about 10,000 times greater than that of a conventional metal conductive line. Therefore, a conductive line composed of a carbon nanotube can be formed having a diameter of about several nanometers to several tens of nanometers, and thus, can be used in the fabrication of ultra-highly integrated semiconductor devices.

Figure 7:
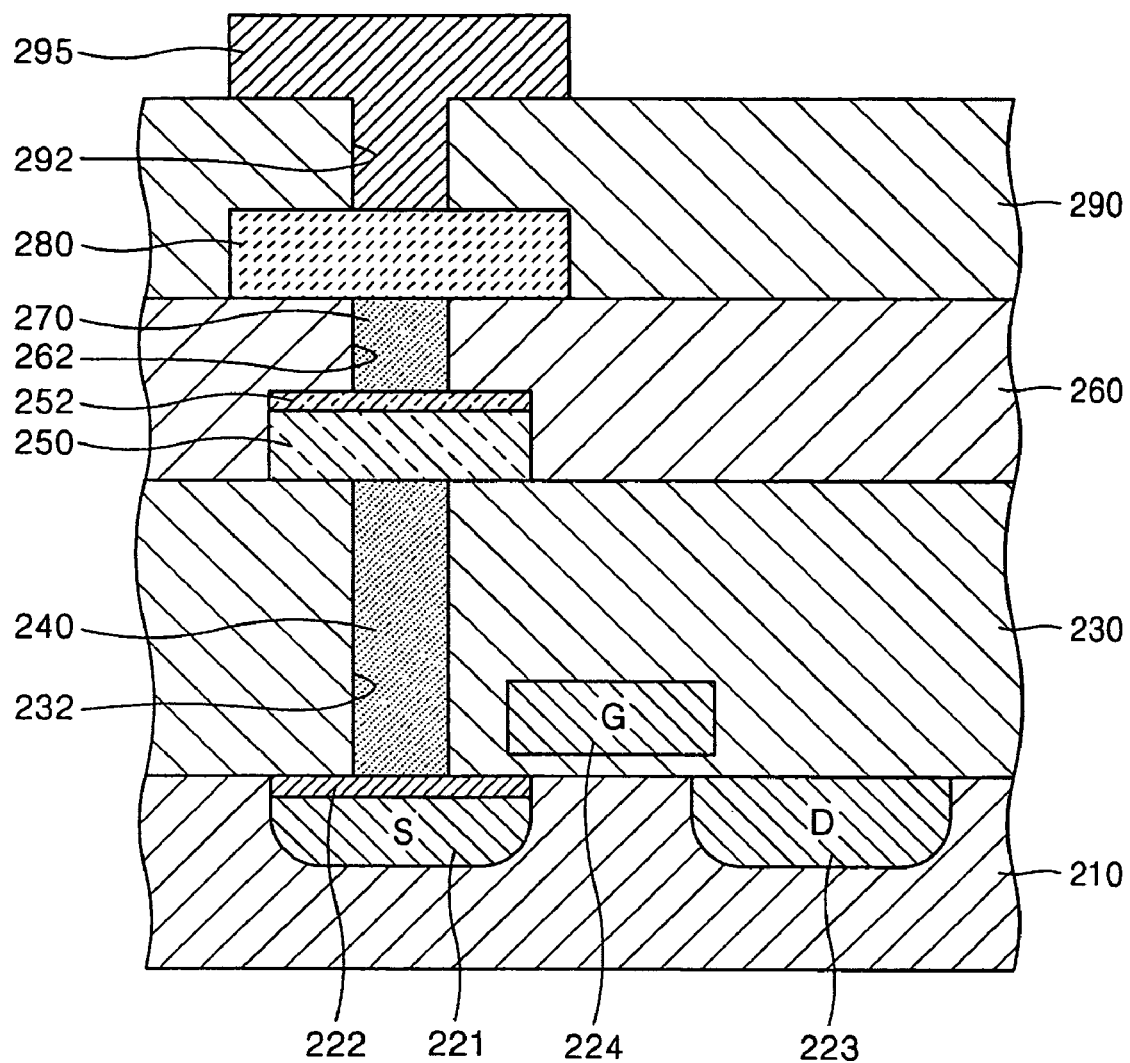
FIG. 7 illustrates a schematic sectional view showing an example of semiconductor devices having conductive lines composed of carbon nanotubes according to a conductive line formation method of the present invention.

FIG. 7 illustrates a schematic sectional view showing an example of semiconductor devices having conductive lines composed of carbon nanotubes according to a conductive line formation method of the present invention.

For exemplary purposes, a semiconductor device shown in FIG. 7 is a phase-change random access memory (PRAM) device having a MOSFET as a switching device. A PRAM is a memory device using a phase-change material that experiences a change of electrical resistance according to a crystal state thereof. The crystal state of a portion of a phase-change material film is changed by a variation in intensity of a current applied to the phase-change material film.

Referring to FIG. 7, as is well known, a MOSFET includes a source electrode 221 and a drain electrode 223 that are formed in a predetermined region of a substrate 210, and a gate electrode 224 that is separated from the source electrode 221 and the drain electrode 223 by a first insulating layer 230. The source electrode 221 and the drain electrode 223 may be made of doped silicon or metal and the gate electrode 224 is primarily made of metal.

A first porous active layer 222 is formed on a surface of the source electrode 221 using the above-described conductive line formation method. Alternatively, a catalytic metal layer may be formed instead of the active layer 222. The first insulating layer 230 is formed on the first active layer 222. A first contact hole 232 is defined by the first insulating layer 230 and exposes a portion of the first active layer 222. A first carbon nanotube 240 is grown in a vertical direction from the first active layer 222 in the first contact hole 232. The first carbon nanotube 240 can have a diameter of about several nanometers to several tens of nanometers depending on the diameter of the first contact hole 232.

Subsequently, an intermediate electrode 250 is formed on the first insulating layer 230 to be connected to the first carbon nanotube 240. Accordingly, the first carbon nanotube 240 forms a conductive line that electrically connects the source electrode 221 and the intermediate electrode 250.

Similarly, a second porous active layer 252 or a catalytic metal layer is formed on a surface of the intermediate electrode 250 according to a conductive line formation method of the present invention. A second insulating layer 260 is formed on the second active layer 252. A second contact hole 262 is defined by the second insulating layer 260 and exposes a portion of the second active layer 252. A second carbon nanotube 270 is grown in a vertical direction from the second active layer 252 in the second contact hole 262.

Next, a memory thin film 280 is formed on the second insulating layer 260 to be connected to the second carbon nanotube 270. The memory thin film 280 is made of a phase-change material. Accordingly, the second carbon nanotube 270 forms a conductive line that electrically connects the intermediate electrode 250 and the memory thin film 280.

Alternatively, the memory thin film 280 may also be directly formed on the first carbon nanotube 240 grown on the source electrode 221 in the absence of the intermediate electrode 250 and the second carbon nanotube 270 formed thereon.

A third insulating layer 290 is formed on the memory thin film 280. A third contact hole 292 is defined by the third insulating layer 290 and exposes a portion of the memory thin film 280. The memory thin film 280 is connected to an upper electrode 295 that is formed on the third insulating layer 290 as well as in the third contact hole 292.

Application of a conductive line formation method of the present invention to a PRAM device was illustrated by way of the foregoing example. However, a conductive line formation method of the present invention may also be applied to various other types of semiconductor memory devices, such as DRAM (Dynamic Random Access Memory or Dynamic RAM), SRAM (Static RAM), and MRAM (Magnetic RAM), in addition to PRAM. In such semiconductor memory devices, various types of transistors can be arranged as a switching device, in addition to a MOSFET.

As is apparent from the above descriptions, according to a method of forming a conductive line for a semiconductor device according to the present invention, a conductive line, such as a contact and an interconnect, which connects two electrodes or an electrode and a memory thin film, can be formed using a carbon nanotube. Such a carbon nanotube has a current density of about $10^{10}$ A/cm$^2$, which is about 10,000 times greater than that of a conventional metal conductive line. Therefore, a conductive line composed of the carbon nanotube can be formed having a diameter of about several nanometers to several tens of nanometers, and thus, can be used in the fabrication of ultra-highly integrated semiconductor devices.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a substrate;
   a first electrode formed on the substrate;
   a porous active layer formed on a surface of the electrode;
   an insulating layer, which is formed on the porous active layer, having a contact hole therethrough to expose a portion of the porous active layer;
   a carbon nanotube, which is grown on the porous active layer in the contact hole and forms a conductive line as a pathway for electron migration; and
   a memory thin film on the insulating layer and electrically connected to the carbon nanotube, wherein the memory thin film is made of a phase-change material.

2. The semiconductor device as claimed in claim 1, wherein the porous active layer is formed by supplying at least one pretreatment gas selected from the group consisting of nitrogen ($N_2$), argon (Ar), and ammonia ($NH_3$), at a temperature in a range of about 300 to 700° C. onto the surface of the electrode.

3. The semiconductor device as claimed in claim 1, wherein the porous active layer is formed by colliding an ionized argon (Ar) or nitrogen ($N_2$) gas with the surface of the electrode.

4. The semiconductor device as claimed in claim 1, wherein the substrate is made of silicon or oxide.

5. The semiconductor device as claimed in claim 1, wherein the first electrode is a source electrode of a Metal Oxide Semiconductor Field Effect Transistor (MOSFET).

6. A method of forming a conductive line for a semiconductor device, comprising:
   (a) forming a catalytic metal layer on a surface of an electrode of the semiconductor device;
   (b) forming an insulating layer on the catalytic metal layer, and forming a contact hole through the insulating layer to expose a portion of the catalytic metal layer;
   (c) supplying a carbon-containing gas onto the catalytic metal layer through the contact hole to grow a carbon nanotube, which forms the conductive line, on the catalytic metal layer; and
   (d) forming a memory thin film on the insulating layer, the memory thin film being electrically connected to the carbon nanotube and being made of a phase-change material.

7. The method as claimed in claim 6, wherein forming the catalytic metal layer comprises depositing a catalytic metal to a predetermined thickness on the surface of the electrode using a radio frequency (RF) magnetron sputter or an e-beam evaporator.

8. The method as claimed in claim 6, wherein forming the catalytic metal layer comprises spraying a catalytic metal powder to a predetermined thickness on the surface of the electrode.

9. The method as claimed in claim 6, wherein the catalytic metal layer is formed to a thickness of about several nanometers to several tens of nanometers.

10. The method as claimed in claim 6, wherein forming the catalytic metal layer comprises using at least one transition metal selected from the group consisting of: tungsten (W), nickel (Ni), iron (Fe), cobalt (Co), yttrium (Y), palladium (Pd), platinum (Pt), or gold (Au).

11. The method as claimed in claim 6, wherein forming the insulating layer comprises using an oxide.

12. The method as claimed in claim 6, wherein forming the contact hole comprises anisotropically etching the insulating layer using a patterned photoresist as an etching mask.

13. The method as claimed in claim 6, wherein forming the contact hole comprises creating the contact hole having a diameter of about several nanometers to several tens of nanometers.

14. The method as claimed in claim 6, further comprising supplying the carbon-containing gas onto the activated surface of the electrode through the contact hole to grow a carbon nanotube at a temperature in a range of about 500 to 900° C.

15. The method as claimed in claim 6, wherein the carbon-containing gas is at least one gas selected from the group consisting of methane ($CH_4$), acetylene ($C_2H_2$), ethylene ($C_2H_4$), ethane ($C_2H_6$), carbon monoxide (CO), and carbon dioxide ($CO_2$).

16. The method as claimed in claim 6, further comprising supplying the carbon-containing gas together with at least one gas selected from the group consisting of hydrogen ($H_2$), nitrogen ($N_2$), and argon (Ar).

17. The method as claimed in claim 6, wherein supplying the carbon-containing gas comprises performing a thermal chemical vapor deposition or a plasma enhanced chemical vapor deposition.

18. A semiconductor device, comprising:
   a substrate;
   a first electrode formed on the substrate;
   a catalytic metal layer formed on a surface of the electrode;
   an insulating layer, which is formed on the catalytic metal layer, having a
   contact hole therethrough to expose a portion of the catalytic metal layer;
   a carbon nanotube, which is grown on the catalytic metal layer in the contact hole and forms a conductive line as a pathway for electron migration; and
   a memory thin film on the insulating layer and electrically connected to the carbon nanotube, wherein the memory thin film is made of a phase-change material.

19. The semiconductor device as claimed in claim 18, wherein the catalytic metal layer is formed by depositing at least one transition metal selected from the group consisting of tungsten (W), nickel (Ni), iron (Fe), cobalt (Co), yttrium (Y), palladium (Pd), platinum (Pt), or gold (Au) using an RF magnetron sputter or an e-beam evaporator on the surface of the electrode.

20. The semiconductor device as claimed in claim 18, wherein the catalytic metal layer is formed by applying a powder of at least one transition metal selected from the group consisting of tungsten (W), nickel (Ni), iron (Fe), cobalt (Co), yttrium (Y), palladium (Pd), platinum (Pt), or gold (Au) onto the surface of the electrode.

21. The semiconductor device as claimed in claim 18, wherein the substrate is made of silicon or oxide.

22. The semiconductor device as claimed in claim 18, wherein the first electrode is a source electrode of a Metal Oxide Semiconductor Field Effect Transistor (MOSFET).

* * * * *